Nov. 15, 1966 D. J. SIEBOLD 3,285,078

UHF-VHF TUNER

Filed Oct. 30, 1964 2 Sheets-Sheet 1

INVENTOR:
DONALD J. SIEBOLD,

BY William S. Wolfe
HIS ATTORNEY.

Nov. 15, 1966 D. J. SIEBOLD 3,285,078

UHF-VHF TUNER

Filed Oct. 30, 1964 2 Sheets-Sheet 2

INVENTOR:
DONALD J. SIEBOLD,

BY William S. Wolfe
HIS ATTORNEY

United States Patent Office 3,285,078
Patented Nov. 15, 1966

3,285,078
UHF-VHF TUNER

Donald J. Siebold, North Syracuse, N.Y., assignor to General Electric Company, a corporation of New York Filed Oct. 30, 1964, Ser. No. 407,784
6 Claims. (Cl. 74—10.54)

This invention relates to a UHF-VHF television tuner and, more particularly, to a UHF-VHF frequency selector and channel indicator mechanism.

In television receivers having the capacity to receive both UHF and VHF frequencies, the tuner employed for selecting the various frequency bands generally includes an incremental frequency band selector. The prior art mechanisms employed for tuning to VHF signals include a knob connected to the incremental frequency band selector shaft by which the frequency band selector is rotated to receive various frequency bands, each of which includes a VHF signal. Fine tuning to the VHF signal is usually achieved by rotating a second knob mounted on a shaft to which a variable VHF tuning coil or capacitor is attached.

For tuning to UHF channels, the frequency band or channel selector knob is rotated to a UHF position and then fine tuning to the particular UHF channels is achieved by rotating a second fine tune knob. In many instances, the UHF fine tuning knob is enlarged and the UHF channel numbers are printed thereon to indicate the particular channel being selected. Consequently, the channel numbers for the VHF broadcasting frequencies appear at one position while the channel numbers for the UHF broadcasting frequencies appear at a second position on the television receiver. Also, as indicated, separate knobs disposed at different positions on the television receiver are required to fine tune to the UHF and VHF signals.

It is therefore an object of this invention to provide a UHF-VHF television tuner which enables the fine tuning of both the UHF and the VHF channels by rotation of a single fine tune knob.

Another object of this invention is to provide a UHF-VHF channel indicator which displays through a single viewer window only the channel number, in either the UHF or VHF frequency range, to which the set is tuned.

In carrying out this invention in one form thereof, a rotatable incremental frequency band selector is employed having a shaft to which a knob is attached. Rotation of the knob operates to select a desired VHF frequency band within which a VHF signal is broadcasted. A VHF channel indicator disc is attached to the shaft, the disc being positioned adjacent a viewer window through which a single VHF channel number appears upon rotation of the frequency band selector knob. The disc has a cut-out portion at one position which is aligned with the viewer window when the frequency band selector is switched to the UHF frequency band. A UHF channel indicator disc is positioned behind the VHF channel indicator disc so that the UHF channel numbers appear through the cut-out portion in the VHF disc when the frequency band selector is switched to the UHF frequency band. The UHF channel indicator disc is rotated in response to rotation of a shaft which controls the UHF fine tune capacitor.

A single or master fine tune shaft has a single fine tune knob attached thereto and is engageable with the UHF fine tune capacitor by a clutch mechanism. Rotation of the fine tune knob when the clutch is engaged operates to fine tune the UHF capacitor to receive selected UHF channels while the UHF channel indicator disc is simultaneously rotated to display the particular UHF channel number through the single viewer window. When the master fine tune knob is pulled axially outwardly, the clutch disengages and a gear member on the master fine tune shaft engages a VHF fine tune gear which, in turn, is attached to a VHF fine tune coil or capacitor shaft. Accordingly, when the incremental frequency band selector knob is positioned to a VHF channel, fine tuning to the VHF signal is achieved by pulling the master fine tune knob outwardly then rotating it to adjust the VHF fine tune coil or capacitor.

For a better understanding of this invention, reference is made to the accompanying drawings in which.

Figure 2:
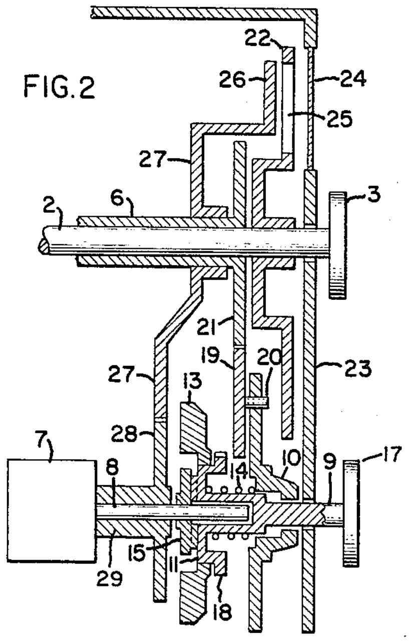
FIGURE 2 is a side view partially in cross section of the assembled mechanism as it appears during UHF fine tuning.
Figure 2A:
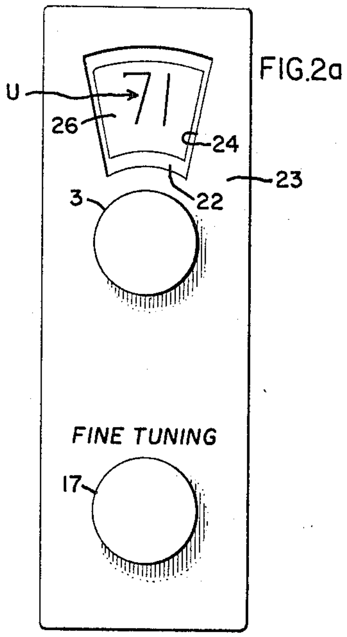

FIGURE 2*a* illustrates the single viewer window displaying a UHF channel number during the UHF frequency reception.

Figure 3:
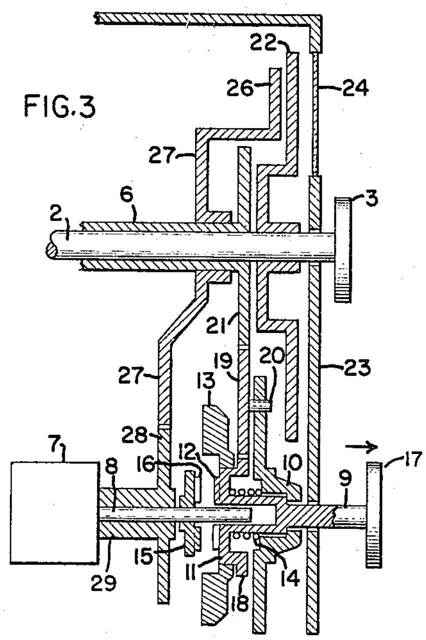

FIGURE 3 is a side view partially in cross section of the assembled frequency selector and channel indicator mechanism during VHF fine tuning.

Figure 3A:
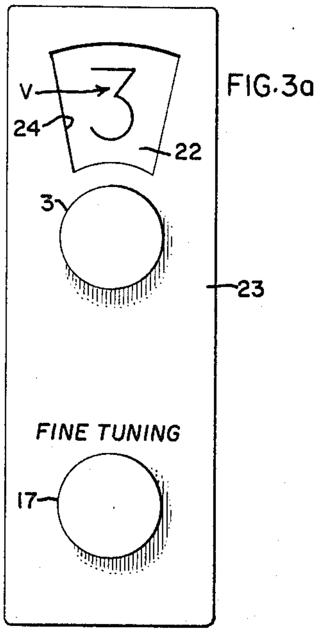

FIGURE 3*a* illustrates the single viewer window displaying a VHF channel number during VHF frequency reception.

Figure 1:
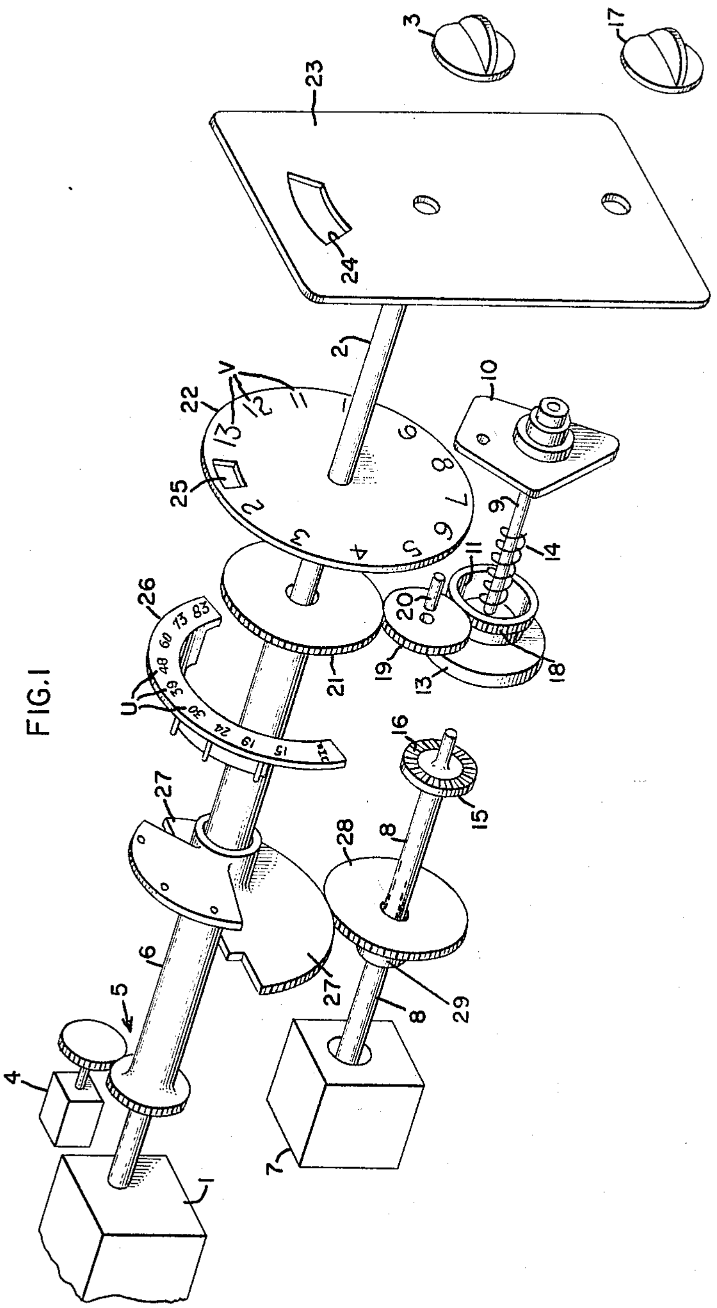
FIGURE 1 is an exploded perspective view of the UHF-VHF frequency selector and channel indicator mechanism.

Referring to FIGURE 1, there is shown an exploded perspective view of the UHF-VHF frequency selector and channel indicator mechanism. An incremental frequency band selector 1, the particular construction of which forms no part of this invention, is actuated by a frequency band selector shaft 2 for receiving a plurality of VHF frequency bands and a UHF frequency band. Conventionally, the incremental frequency band selector 1 contains twelve VHF frequency band positions and a UHF frequency band position. The frequency band selector shaft 2 is actuated manually by a knob 3 or by automatic motorized means (not shown). When the incremental frequency band selector 1 is positioned to receive signals from any of the VHF frequency bands, clarity of reception of the VHF signals is achieved by operating a VHF fine tune mechanism 4 which is adjusted through a gear train 5 by rotation of a VHF fine tune drive shaft 6. The VHF fine tune drive shaft 6 is a hollow shaft which surrounds and is coaxially disposed relative to the frequency band selector shaft 2. Each shaft rotates independently of the other.

When the incremental frequency band selector 1 is positioned to receive signals in the UHF frequency band, reception of the signals from selected UHF frequencies is achieved by adjustment of a UHF fine tune mechanism 7. Although conventional UHF fine tune mechanisms generally consist of a variable capacitor, the particular structure forms no part of the present invention. The UHF fine tune mechanism is adjusted by rotation of a UHF fine tune drive shaft 8, a conventional gear arrangement (not shown) being provided within the fine tune mechanism to provide the desired vernier action.

A single master fine tune shaft 9 is employed to selectively engage either the VHF fine tune drive shaft 6 or the UHF fine tune drive shaft 8 for fine tuning the UHF and VHF fine tune mechanisms. The master fine tune shaft 9 is mounted in a bearing 10 for rotational and axial movement relative thereto. The bearing 10 is fixedly secured to the tuning superstructure (not shown) so that the master fine tune shaft is coaxially disposed with the UHF fine tune drive shaft 8. A radial extension 11 projects from the end of the master fine tune shaft which faces the UHF fine tune drive shaft 8. The position of the radial extension 11 can be better appreciated by referring to FIGURES 2 and 3. A friction engaging surface 12 as shown most clearly in FIGURE 3, is provided on the radial face of the radial extension 11. Secured to the radial extension 11 by a shrink fit or similar joining means is a flywheel 13. A spring member 14 is positioned between the opposite face of the radial extension 11 and the bearing member 10 such that the force of the spring member tends to urge the axially movable master fine tune shaft 9 toward the UHF fine tune drive shaft 8.

A clutch plate 15 is fixedly secured to the UHF fine tune drive shaft 8 and has a frictional engaging surface 16 thereon which faces the frictional engaging surface 12 on the radial extension 11 of the master fine tune shaft 9. Normally the spring member 14 maintains the frictional surface 12 in engagement with the frictional surface 16 so that rotation of the master fine tune shaft 9 is transmitted to the UHF fine tune drive shaft 8. The master fine tune shaft 9 may be operated by rotating a knob 17 attached thereto, or adjustment may be achieved by an automatic motorized means (not shown).

To operate the VHF fine tune mechanism 4 by the master fine tune shaft 9, gear teeth 18 are provided on the radial extension 11 of the master fine tune shaft 9. The gear teeth 18 are engageable with an idler gear member 19 which is mounted for rotation on a shaft 20. The shaft 20 is secured to an extension of the bearing member 10. The idler gear 19 meshes with and transmits rotational movement to a VHF fine tune gear 21 which is, in turn, mounted for rotation with the VHF fine tune drive shaft 6.

Normally, the spring 14 urges the frictional surface 12 of the radial extension 11 into engagement with the clutch plate 15 and, consequently, the gear teeth 18 are not in meshed engagement with the idler gear 19. Thus, in this position, rotation of the master fine tune shaft 9 rotates the UHF fine tune drive shaft 8 and does not rotate the VHF fine tune shaft 6. When the master fine tune shaft 9 is pulled axially outwardly against the force of the spring member 14 to disengage the radial extension 11 from the clutch plate 15, the gear teeth 18 are brought into meshed engagement with the idler gear 19 and, hence, rotation of the master fine tune shaft while held in this position results in rotation of the VHF fine tune drive shaft 6 for adjusting the VHF fine tune mechanism 4. By employing the above-described frequency selector mechanism, independent fine tuning of both UHF and VHF fine tune mechanisms is achieved by a single master fine tune control.

To facilitate tuning to the broadcasting frequencies represented by UHF or VHF channel numbers, a channel indicator mechanism is combined with the frequency selector mechanism for providing through a single viewer window the number of the channel, in either the UHF or VHF frequency range, to which the set is tuned.

In order to receive the signal from any of the VHF frequency bands, the frequency band selector shaft 2 is rotated by the frequency band selector knob 3. A VHF channel indicator disc 22 is mounted for rotation with the frequency band selector shaft 2. A plurality of VHF channel numbers V are circularly arranged on the VHF channel indicator disc 22. The disc 22 is mounted on the frequency band selector shaft adjacent to a tuner face plate 23. A viewer window 24, which generally has a tinted glass therein, enables viewing of the individual VHF channel numbers V when each number is brought into alignment therewith, as illustrated in FIGURE 3*a*. The VHF channel indicator disc is angularly arranged on the frequency band selector shaft 2 so that a single VHF channel number appears through the viewer window 24 when the incremental frequency band selector 1 is positioned to receive each of the the VHF frequency bands. A cut-out portion 25 is disposed in the VHF channel indicator disc 22 and is angularly arranged relative to the frequency band selector shaft 2 so that the cut-out portion 25 is aligned with the viewer window 24 when the incremental frequency band selector 1 is positioned to receive the UHF frequency band.

A UHF channel indicator disc 26 is mounted on an independently rotatable gear member 27 positioned adjacent to and rearwardly of the VHF channel indicator disc 22. A plurality of UHF channel numbers U are circularly arranged on the UHF channel indicator disc 26 and may be individually displayed through the viewer window 24 and the cut-out portion 25 upon rotation of the independently rotatable gear member 27. Since the cut-out portion 25 is aligned with the viewer window 24 only when the incremental frequency band selector 1 is positioned to receive the UHF frequency band, the UHF channel numbers appear through the viewer window only when the UHF frequency band is being received, as indicated in FIGURE 2*a*. The individual UHF channel numbers U are rotated into alignment with the viewer window 24 in response to rotation of the UHF fine tune drive shaft 8. A UHF fine tune gear member 28 having a shaft portion 29 surrounds and is coaxially disposed relative to UHF fine tune drive shaft 8 and is rotated at a reduced speed with the UHF fine tune drive shaft 8 through the use of a conventional gear arrangement (not shown) positioned within the UHF fine tune mechanism 7. The gear member 28 is disposed in meshed engagement with the independently rotatable gear member 27.

In operation, the frequency band selector knob 3 is rotated to select a desired VHF frequency band, the selection being visually indicated by a VHF channel number V displayed within the single viewer window 24. After a desired VHF frequency band has been selected, fine tuning to the signal broadcasted therein is achieved by pulling the master fine tune knob 17 outwardly and rotating the knob, the rotational movement being transmitted by the master fine tune shaft 9 through the gear teeth 18, the idler gear member 19, and the VHF fine tune gear member 21 to rotate the VHF fine tune drive shaft 6 which, in turn, adjusts the VHF fine tune mechanism 4.

To select a UHF channel, the frequency band selector knob 3 is rotated to the UHF frequency band position which is indicated by the appearance of a cut-out portion 25 in the viewer window 24 and, consequently, the UHF channel indicator disc appears through the single viewer window 24. The particular UHF channel desired is tuned by merely rotating the fine tune knob 17 until the desired UHF channel number appears in the viewer window 24. Rotation of the fine tune knob 17 without pulling it axially outwardly results in rotation of the UHF fine tune drive shaft 8 through the clutch plate 15.

From the foregoing discussion, it will be apparent that the UHF-VHF frequency selector and channel indicator mechanism provides a simple means for fine tuning a television set to both UHF or VHF channels by rotating a master fine tune knob, and provides a single convenient indicator or viewer window for visually appreciating the channel number to which the television set is tuned.

While a specific embodiment of this invention has been shown and described, it is not intended that the invention be limited to the particular structure and it is intended by the appended claims to cover all modifications within the spirit and scope of this invention.

I claim:

1. A combined UHF-VHF frequency selector and channel indicator mechanism comprising:

(a) a frequency band selector shaft for positioning an incremental frequency band selector to receive a plurality of VHF frequency bands and a UHF frequency band, (b) a master fine tune shaft for operating a VHF and a UHF fine tune mechanism for tuning to selected frequencies in said VHF and said UHF frequency bands, (c) means for selectively engaging said master fine tune shaft with said VHF fine tune mechanism and said UHF fine tune mechanism, (d) a VHF channel indicator disc having a plurality of VHF channel numbers thereon and arranged for selectively aligning with a single viewer window one of the VHF channel numbers in response to positioning of said frequency band selector for receiving each of said VHF frequency bands, said VHF channel indicator disc being provided with a window portion thereon, and (e) a UHF channel indicator disc having a plurality of UHF channel numbers thereon and arranged for selectively aligning with the window portion of said VHF channel indicator disc and the single viewer window one of the UHF channel numbers in response to movement of said UHF fine tune mechanism when said frequency band selector is positioned for receiving said UHF frequency band.

2. A combined UHF-VHF frequency selector and channel indicator mechanism comprising:

(a) a frequency band selector shaft for positioning an incremental frequency band selector to receive a plurality of VHF frequency bands and a UHF frequency band, (b) a master fine tune shaft, said master fine tune shaft being mounted in a bearing member for rotational and axial movement relative to said bearing member, (c) means for selectively engaging said master fine tune shaft with a UHF fine tune mechanism when said master fine tune shaft is moved axially in one direction, and (d) means for selectively engaging said master fine tune shaft with a VHF fine tune mechanism when said master fine tune shaft is moved axially in another direction so that said master fine tune shaft operates to fine tune both said UHF and said VHF frequency bands, (e) a VHF channel indicator disc secured to said frequency band selector shaft for rotation therewith and arranged for selectively aligning with a single viewer window one of a plurality of VHF channel numbers in response to positioning of said frequency band selector for receiving each of said VHF frequency bands, said VHF channel indicator disc being provided with a window portion thereon, and (f) a UHF channel indicator disc rotatably mounted on said frequency selector shaft rearwardly of said VHF channel indicator disc and arranged for selectively aligning with the window portion of said VHF channel indicator disc and the single viewer window one of a plurality of UHF channel numbers in response to movement of said UHF fine tune mechanism when said frequency band selector is positioned for receiving said UHF frequency band.

3. A combined UHF-VHF frequency selector and channel indicator mechanism comprising:

(a) a frequency band selector shaft for positioning an incremental frequency band selector to receive a plurality of VHF frequency bands and a UHF frequency band, (b) a master fine tune shaft having a flywheel mounted thereon, said master fine tune shaft being mounted in a bearing member for rotational and axial movement relative to said bearing member, (c) means for selectively engaging said master fine tune shaft with a UHF fine tune mechanism when said master fine tune shaft is moved axially in one direction, and (d) means for selectively engaging said master fine tune shaft with a VHF fine tune mechanism when said master fine tune shaft is moved axially in another direction so that said master fine tune shaft operates to fine tune both said UHF and said VHF frequency bands, (e) a VHF channel indicator mechanism for displaying through a viewer window one of a plurality of VHF channel numbers in response to positioning of said frequency band selector for receiving each of said VHF frequency bands, and (f) a UHF channel indicator mechanism for displaying through the viewer window one of a plurality of UHF channel numbers in response to movement of said UHF fine tune mechanism when said frequency band selector is positioned for receiving said UHF frequency band, and (g) a radially projecting portion on said master fine tune shaft, said radially projecting portion having radial face with a frictional engaging surface thereon, (h) a UHF fine tune shaft for operating said UHF fine tune mechanism, said UHF fine tune drive shaft disposed coaxially relative to said master fine tune shaft, (i) a clutch plate mounted for rotation with said UHF fine tune shaft, said clutch plate having a frictional engaging surface facing said radial face of said master fine tune shaft, (j) a spring member disposed between said bearing member and said radially projecting portion for urging said master fine tune shaft axially inwardly toward said UHF fine tune drive shaft and for engaging said radial face with said clutch plate whereby rotational movement of said master fine tune shaft is transmitted to said UHF fine tune drive shaft for operating said UHF fine tune mechanisms.

4. A combined UHF-VHF frequency selector and channel indicator mechanism comprising:

(a) a frequency band selector shaft for positioning an incremental frequency band selector to receive a plurality of VHF frequency bands and a UHF frequency band, (b) a master fine tune shaft having a flywheel mounted thereon, said master fine tune shaft being mounted in a bearing member for rotational and axial movement relative to said bearing member, (c) means for selectively engaging said master fine tune shaft with a UHF fine tune mechanism when said master fine tune shaft is moved axially in one direction, and (d) means for selectively engaging said master fine tune shaft with a VHF fine tune mechanism when said master fine tune shaft is moved axially in another direction so that said master fine tune shaft operates to fine tune both said UHF and said VHF frequency bands, (e) a VHF channel indicator mechanism for displaying through a viewer window one of a plurality of VHF channel numbers in response to positioning of said frequency band selector for receiving each of said VHF frequency bands, and (f) a UHF channel indicator mechanism for displaying through the viewer window one of a plurality of UHF channel numbers in response to movement of said UHF fine tune mechanism when said frequency band selector is positioned for receiving said UHF frequency band, and (g) a VHF fine tune drive shaft for operating said VHF fine tune mechanism, (h) a first gear member mounted for rotation with said VHF fine tune drive shaft, (i) a second gear member mounted for rotation in meshed engagement with said first gear member, and (j) a third gear member mounted for rotation with said axially movable master fine tune shaft, said third gear member being movable into meshed engagement with said second gear member when said master fine tune shaft is moved axially outwardly whereby rotational movement of said master fine tune shaft is transmitted through said third, second, and first gear members to said VHF fine tune drive shaft for operating said VHF fine tune mechanism.

5. A combined UHF-VHF frequency selector and channel indicator mechanism comprising:

(a) a frequency band selector shaft for positioning an incremental frequency band selector to receive a plurality of VHF frequency bands and a UHF frequency band, (b) a master fine tune shaft having a flywheel mounted thereon, said master fine tune shaft being mounted in a bearing member for rotational and axial movement relative to said bearing member, (c) means for selectively engaging said master fine tune shaft with a UHF fine tune mechanism when said master fine tune shaft is moved axially in one direction, and (d) means for selectively engaging said master fine tune shaft with a VHF fine tune mechanism when said master fine tune shaft is moved axially in another direction so that said master fine tune shaft operates to fine tune both said UHF and said VHF frequency bands, (e) a VHF channel indicator mechanism for displaying through a viewer window one of a plurality of VHF channel numbers in response to positioning of said frequency band selector for receiving each of said VHF frequency bands, and (f) a UHF channel indicator mechanism for displaying through the viewer window one of a plurality of UHF channel numbers in response to movement of said UHF fine tune mechanism when said frequency band selector is positioned for receiving said UHF frequency band, and (g) a VHF channel indicator disc having a plurality of VHF channel numbers circularly arranged on one face thereof and a cut-out portion provided in said arrangement of VHF channel numbers, and (h) mounting means for securing said VHF channel indicator disc on said frequency band selector shaft for rotation therewith, said VHF channel indicator disc arranged relative to said frequency band selector shaft so that one of said VHF channel numbers is aligned with the viewer window upon rotation of said incremental frequency band selector for receiving each of said VHF frequency bands, and said cut-out portion being aligned with the viewer window upon rotation of said frequency band selector shaft for receiving said UHF frequency band.

6. A combined UHF-VHF frequency selector and channel indicator mechanism as recited in claim 6 wherein said UHF channel indicator mechanism comprises:

(a) a UHF channel indicator disc rotatably mounted on said frequency band selector shaft rearwardly of said VHF channel indicator disc and having a plurality of UHF channel numbers arranged circularly on one face thereof, (b) a first gear member attached to and mounted for rotation with said UHF indicator disc, and (c) a second gear member mounted for rotation with the UHF fine tune mechanism, said second gear member being meshed with said first gear member whereby rotation of the UHF fine tune mechanism to receive signals within said UHF frequency band is accompanied by rotation of said UHF channel indicator disc, said UHF channel numbers individually appearing in the viewer window when said frequency band selector is positioned for receiving said UHF frequency band and said cut-out portion of said VHF indicator disc is aligned with said viewer window.

References Cited by the Examiner

UNITED STATES PATENTS

| | | | |
|---|---|---|---|
| 2,756,599 | 7/1956 | Sperber | 74—10.5 |
| 2,839,936 | 6/1958 | Dawson | 74—10.8 X |
| 2,873,610 | 2/1959 | Williams | 74—10.45 |
| 3,205,720 | 9/1965 | Smith | 74—10.8 |

MILTON KAUFMAN, *Primary Examiner.*